United States Patent
Ishida et al.

(10) Patent No.: US 10,553,421 B2
(45) Date of Patent: Feb. 4, 2020

(54) SUBSTRATE PROCESSING APPARATUS, SUBSTRATE PROCESSING METHOD AND STORAGE MEDIUM

(71) Applicant: Tokyo Electron Limited, Tokyo (JP)

(72) Inventors: Seiki Ishida, Kumamoto (JP); Shogo Fukui, Kumamoto (JP); Hidetaka Shinohara, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 57 days.

(21) Appl. No.: 15/149,734

(22) Filed: May 9, 2016

(65) Prior Publication Data
US 2016/0336170 A1 Nov. 17, 2016

(30) Foreign Application Priority Data

May 15, 2015 (JP) .................................. 2015-100082
Nov. 13, 2015 (JP) .................................. 2015-223311

(51) Int. Cl.
*H01L 21/02* (2006.01)
*H01L 21/67* (2006.01)
*H01L 21/687* (2006.01)

(52) U.S. Cl.
CPC .... *H01L 21/02041* (2013.01); *H01L 21/6708* (2013.01); *H01L 21/67017* (2013.01); *H01L 21/67051* (2013.01); *H01L 21/68792* (2013.01)

(58) Field of Classification Search
CPC ......... H01L 21/02041; H01L 21/67051; H01L 21/6708
See application file for complete search history.

(56) References Cited

U.S. PATENT DOCUMENTS

| 5,565,034 | A | * | 10/1996 | Nanbu | H01L 21/67173 118/319 |
| 6,427,717 | B1 | * | 8/2002 | Kimura | F16L 53/32 137/340 |
| 8,496,780 | B2 | * | 7/2013 | Ronsse | C23C 16/407 118/715 |
| 2002/0062840 | A1 | * | 5/2002 | Verhaverbeke | B08B 3/02 134/1.3 |

(Continued)

FOREIGN PATENT DOCUMENTS

| JP | 2000-061408 A | 2/2000 |
| JP | 2003-197597 A | 7/2003 |

(Continued)

*Primary Examiner* — Joseph L. Perrin
*Assistant Examiner* — Kevin G Lee
(74) *Attorney, Agent, or Firm* — Abelman, Frayne & Schwab

(57) ABSTRACT

Disclosed is a substrate processing apparatus. The substrate processing apparatus includes a first nozzle that ejects droplets of a chemical liquid toward a front surface of a substrate, the droplets being formed by mixing a gas supplied by a gas supply mechanism and a heated chemical liquid supplied by a heated chemical liquid supply mechanism with each other, and a second nozzle that ejects the heated deionized water supplied by the heated deionized water supply mechanism toward the rear surface of the substrate. The first nozzle supplies the droplets to the front surface of the substrate heated from the rear surface thereof by the heated deionized water supplied from the second nozzle.

26 Claims, 9 Drawing Sheets

(56) References Cited

U.S. PATENT DOCUMENTS

| | | | |
|---|---|---|---|
| 2004/0244384 A1* | 12/2004 | Yamazaki | H01L 21/67109 62/3.2 |
| 2005/0178321 A1 | 8/2005 | Nguyen | |
| 2007/0068558 A1* | 3/2007 | Papanu | G03F 1/82 134/29 |
| 2007/0087456 A1* | 4/2007 | Hashizume | H01L 21/67051 438/6 |
| 2008/0023049 A1 | 1/2008 | Matsumoto et al. | |
| 2008/0118629 A1* | 5/2008 | Shimoda | H01L 51/0005 427/8 |
| 2010/0200547 A1* | 8/2010 | Higashijima | H01L 21/67034 216/92 |
| 2012/0103371 A1* | 5/2012 | Yun | H01L 21/67034 134/26 |
| 2012/0142196 A1 | 6/2012 | Rye et al. | |

FOREIGN PATENT DOCUMENTS

| | | |
|---|---|---|
| JP | 2004-235559 A | 8/2004 |
| JP | 2008-246319 A | 10/2008 |
| JP | 2009-064795 A | 3/2009 |
| JP | 2010-050436 A | 3/2010 |
| JP | 2012-114409 A | 6/2012 |
| JP | 2012-153934 A | 8/2012 |

* cited by examiner

SUBSTRATE PROCESSING APPARATUS, SUBSTRATE PROCESSING METHOD AND STORAGE MEDIUM

CROSS-REFERENCE TO RELATED APPLICATIONS

This application is based on and claims priority from Japanese Patent Application Nos. 2015-100082 and 2015-223311, filed on May 15, 2015 and Nov. 13, 2015, respectively, with the Japan Patent Office, the disclosures of which are incorporated herein in their entireties by reference.

TECHNICAL FIELD

The present disclosure relates to a substrate processing apparatus which performs a processing on a substrate by ejecting, to the substrate, droplets of a chemical liquid produced by mixing the chemical liquid with a gas.

BACKGROUND

In a semiconductor device manufacturing process, a cleaning processing for removing contaminants (e.g., particles or polymers) attached to a surface of a substrate is performed by causing a chemical liquid such as, for example, SC-1 (a mixed solution of ammonia water and hydrogen peroxide) to join with a flow of a gas and be sprayed to the surface of the substrate. When this cleaning processing is performed by using a sheet-type cleaning apparatus, the substrate is held by a substrate holder, which is called a spin chuck, to be rotated around a vertical axis. A chemical liquid is supplied to the substrate from a nozzle disposed above the rotating substrate. In a case of using a two-fluid nozzle for the chemical liquid supply, a collision position of the droplets sprayed from the two-fluid nozzle on the surface of the substrate moves between the center portion of the substrate and the peripheral portion thereof. In Japanese Patent Laid-Open Publication No. 2008-246319, a removal performance of contaminants is improved by increasing a temperature of droplets ejected from a two-fluid nozzle. However, in a case of performing a polymer removal, a sufficient removal performance may not be achieved only by the method of Japanese Patent Laid-Open Publication No. 2008-246319.

SUMMARY

An exemplary embodiment of the present disclosure provides a substrate processing apparatus including a substrate holding unit configured to hold a substrate, a heated chemical liquid supply mechanism configured to supply a heated chemical liquid, a gas supply mechanism configured to supply a gas, a heated deionized water supply mechanism configured to supply heated deionized water, a first nozzle configured to eject droplets of the chemical liquid toward the front surface of the substrate, the droplets formed by mixing the gas supplied by the gas supply mechanism and the heated chemical liquid supplied by the heated chemical liquid supply mechanism with each other, and a second nozzle configured to eject the heated deionized water supplied by the heated deionized water supply mechanism toward the rear surface of the substrate, wherein the first nozzle supplies the droplets to the front surface of the substrate heated from the rear surface thereof by the heated deionized water supplied from the second nozzle.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
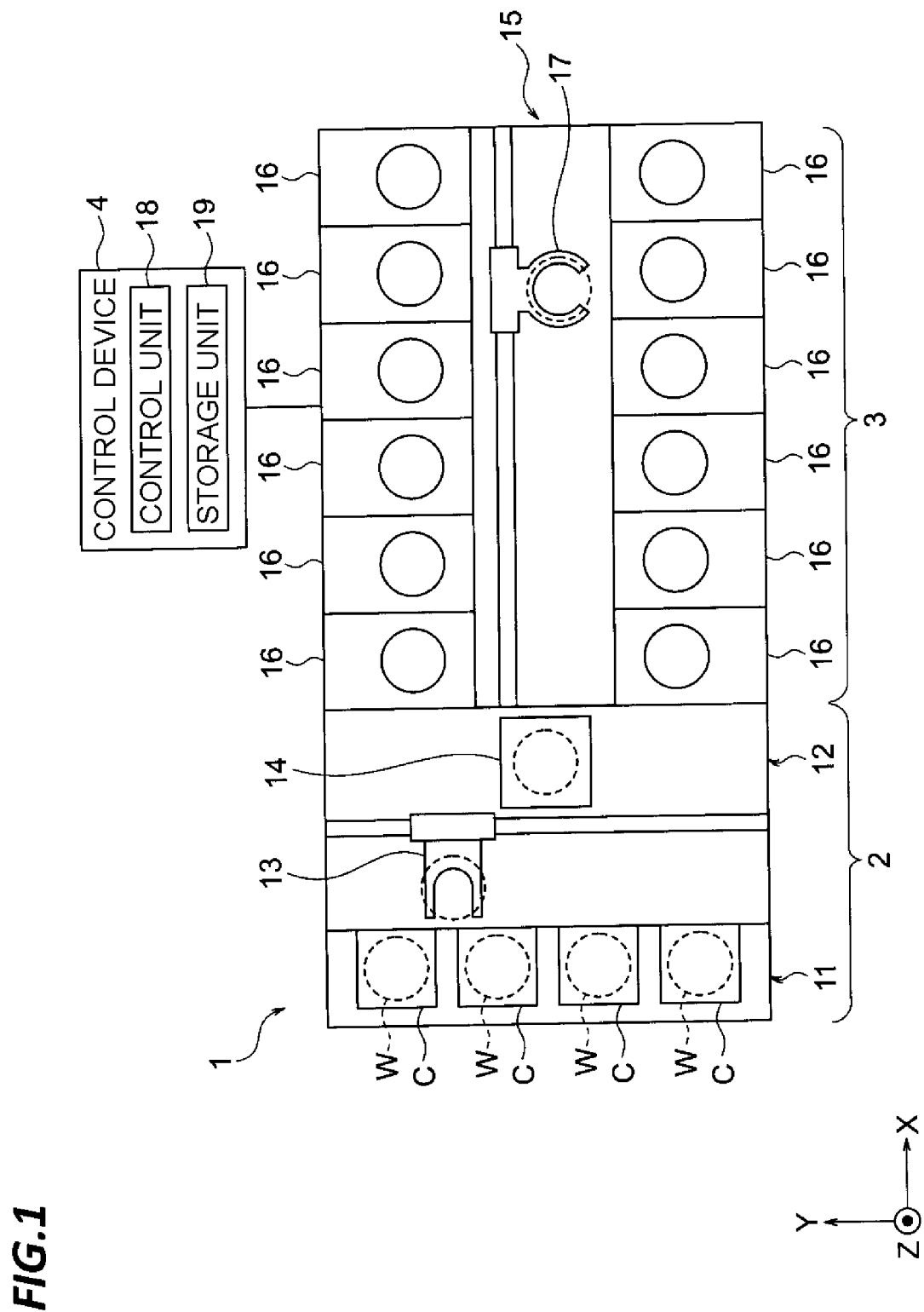
FIG. 1 is a view illustrating a schematic configuration of a substrate processing system according to an exemplary embodiment of the present disclosure.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure provides a technique which is capable of achieving a sufficient removal performance in removing polymers attached to a substrate by using droplets of a chemical liquid produced by mixing a chemical liquid and a gas with each other.

An exemplary embodiment of the present disclosure provides a substrate processing apparatus including a substrate holding unit configured to hold a substrate, a heated chemical liquid supply mechanism configured to supply a heated chemical liquid, a gas supply mechanism configured to supply a gas, a heated deionized water supply mechanism configured to supply heated deionized water, a first nozzle configured to eject droplets of the chemical liquid toward the front surface of the substrate, the droplets formed by mixing the gas supplied by the gas supply mechanism and the heated chemical liquid supplied by the heated chemical liquid supply mechanism with each other, and a second nozzle configured to eject the heated deionized water supplied by the heated deionized water supply mechanism toward the rear surface of the substrate, wherein the first nozzle supplies the droplets to the front surface of the substrate heated from the rear surface thereof by the heated deionized water supplied from the second nozzle.

In the above-described substrate processing apparatus, the heated chemical liquid supply mechanism includes a chemical liquid temperature control mechanism. The chemical liquid temperature control mechanism includes a temperature controller configured to supply a temperature-controlled temperature control liquid and a water jacket that surrounds a chemical liquid pipe configured to supply the heated chemical liquid to the first nozzle and is supplied with the temperature control liquid supplied from the temperature controller.

In the above-described substrate processing apparatus, the heated deionized water supply mechanism includes a deionized water temperature control mechanism. The deionized water temperature control mechanism includes a temperature controller configured to supply a temperature-controlled temperature control liquid, and a water jacket that surrounds a deionized water pipe configured to supply the heated deionized water to the second nozzle and is supplied with the temperature control liquid supplied from the temperature controller.

In the above-described substrate processing apparatus, the heated chemical liquid supply mechanism includes a chemical liquid tank that stores the chemical liquid. The heated deionized water supply mechanism includes a deionized water temperature controller configured to heat the deionized water to be supplied to the second nozzle. A deionized water jacket is provided to surround the periphery of the chemical liquid tank. The deionized water heated by the deionized water temperature controller is supplied to the heated deionized water jacket so as to warm or heat the chemical liquid stored within the chemical liquid tank. The deionized water discharged from the heated deionized water jacket is returned to the deionized water temperature controller.

In the above-described substrate processing apparatus, the chemical liquid is obtained by diluting a chemical liquid component with deionized water. The heated deionized water supply mechanism includes a heated deionized water line configured to supply the deionized water heated by the deionized water temperature controller to the second nozzle. The heated deionized water line is provided with a first branched line that is branched from the heated deionized water line to supply the heated deionized water flowing in the heated deionized water line to the chemical liquid tank as a diluent for formulating the chemical liquid, and a second branched line that is branched from the heated deionized water line to supply the heated deionized water flowing in the heated deionized water line to the heated deionized water jacket. The position where the second branched line is branched from the heated deionized water line is placed at the upstream side of the heated deionized water line relative to the position where the first branched line is branched from the heated deionized water line.

In the above-described substrate processing apparatus, the substrate holding unit includes a plate portion that is disposed below the substrate to face the substrate, and a holding unit that is provided at the peripheral portion of the plate portion to hold the peripheral portion of the substrate. The first nozzle supplies the droplets to the front surface of the substrate in a state where the space between the substrate and the plate portion is filled with the heated deionized water ejected from the second nozzle.

The above-described substrate processing apparatus further includes a rotation driving unit configured to rotate the substrate holding unit, and a recovery cup that surrounds the periphery of the substrate holding unit and receives and recovers the chemical liquid scattered from the substrate held by the substrate holding unit to be rotated. The recovery cup includes an upper cup body that includes an upper portion inclined radially inwardly toward the top end thereof and a cylindrical lower portion, and a groove that is adhered to the outside relative to the top end of the upper portion of the upper cup body so as to enable a liquid passing downwardly outside the lower portion of the upper cup body to flow downwardly inwardly relative to the lower portion.

In the above-described substrate processing apparatus, the recovery cup further includes a cylindrical external cup body that supports the upper cup body therein and is relatively movable up and down with respect to the substrate holding unit. A gap is formed between the external cup body and the lower portion of the upper cup body so as to enable a liquid to pass between the external cup body and the lower portion of the upper cup body.

The above-described substrate processing apparatus further includes a partition plate that defines a portion of a processing chamber to contact the top end of the external cup body when the external cup body is moved up. A liquid attached to the partition plate passes through the gap between the external cup body and the lower portion of the upper cup body.

The above-described substrate processing apparatus further includes a partition plate that defines the bottom surface of the processing chamber, a rotation driving unit that rotates the substrate holding unit, a recovery cup that surrounds the periphery of the substrate holding unit and receives and recovers the chemical liquid scattered from the substrate held by the substrate holding unit to be rotated, a nozzle arm configured to hold the first nozzle, and an arm driving mechanism configured to move the nozzle arm. The height of the partition plate in the region where the nozzle arm stands by is lower than the height of the partition plate in the region around the recovery cup.

The above-described substrate processing apparatus further includes a nozzle arm that holds the first nozzle, an arm driving mechanism that moves the nozzle arm, and a partition plate that partitions the processing chamber into a first section positioned above the substrate holding unit and a second section positioned next to the second section to accommodate the arm driving mechanism. A slit is formed in the partition plate to allow the movement of the nozzle.

In the above-described substrate processing apparatus, an exhaust port is provided in the upper portion of the second section to suck the atmosphere of the second section.

Another exemplary embodiment of the present disclosure provides a substrate liquid processing method of a substrate processing apparatus. The substrate processing apparatus includes a substrate holding unit configured to hold a substrate, a heated chemical liquid supply mechanism configured to supply a heated chemical liquid, a gas supply mechanism configured to supply a gas, a heated deionized water supply mechanism configured to supply heated deionized water, a first nozzle configured to eject droplets of the chemical liquid toward the front surface of the substrate, the droplets formed by mixing the gas supplied by the gas supply mechanism and the heated chemical liquid supplied by the heated chemical liquid supply mechanism with each other, and a second nozzle configured to eject the heated deionized water supplied by the heated deionized water supply mechanism toward the rear surface of the substrate. The substrate liquid processing method includes initiating ejection of the heated deionized water toward the rear surface of the substrate from the second nozzle, and initiating ejection of the droplets toward the front surface of the substrate from the first nozzle after the initiation of the ejection of the heated deionized water toward the rear surface of the substrate from the second nozzle.

In the above-described substrate liquid processing method, the substrate holding unit includes a plate portion that is disposed below the substrate to face the substrate, and a holding unit that is provided at the peripheral portion of the plate portion to hold the peripheral portion of the substrate. The space between the substrate and the plate portion is filled with the heated deionized water by the ejecting of the heated deionized water toward the rear surface of the substrate from the second nozzle. In this state, the ejecting of the droplets from the first nozzle is performed.

In the above-described substrate liquid processing method, the ejecting of the droplets from the first nozzle is performed by moving a liquid landing point of the droplets on the front surface of the substrate between the center portion of the substrate and the peripheral portion thereof while rotating the substrate. The substrate liquid processing method further includes ejecting a drying suppressing liquid toward the center portion of the front surface of the substrate during the ejecting of the droplets.

In the above-described substrate liquid processing method, the ejecting of the droplets from the first nozzle is performed by moving a liquid landing point of the droplets on the front surface of the substrate between the center portion of the substrate and the peripheral portion thereof while rotating the substrate. The moving speed of the liquid landing point of the droplets is determined depending on the temperature of the heated deionized water to be ejected from the second nozzle.

In the above-described substrate liquid processing method, the heated deionized water is ejected toward the rear surface of the substrate from the second nozzle after the initiation of the ejecting of the droplets from the first nozzle toward the front surface of the substrate.

In the above-described substrate liquid processing method, the ejecting of the droplets from the first nozzle is performed by moving a liquid landing point of the droplets on the front surface of the substrate between the center portion of the substrate and the peripheral portion thereof while rotating the substrate. The moving speed of the liquid landing point of the droplets is set to a speed at which a liquid film of the chemical liquid on the front surface of the substrate is not lost.

In the above-described substrate liquid processing method, the heated deionized water is ejected toward the rear surface of the substrate from the second nozzle after the initiation of the ejecting of the droplets from the first nozzle toward the front surface of the substrate. The ejecting of the droplets from the first nozzle is performed by moving a liquid landing point of the droplets on the front surface of the substrate between the center portion of the substrate and the peripheral portion thereof while rotating the substrate. The moving speed of the liquid landing point of the droplets is set to a speed at which a liquid film of the chemical liquid on the front surface of the substrate is not lost.

Another exemplary embodiment of the present disclosure provides a storage medium that stores a program that, when executed by a computer for controlling an operation of a substrate processing apparatus, causes the computer to control the substrate processing apparatus to perform the substrate processing method.

According to the above-described exemplary embodiments, a sufficient removal performance may be achieved in removing polymers attached to a substrate by using droplets of a chemical liquid produced by mixing a chemical liquid and a gas with each other.

FIG. 1 is a view illustrating a schematic configuration of a substrate processing system according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of wafers W horizontally.

The transfer section 12 is provided adjacent to the carrier placing section 11, and provided with a substrate transfer device 13 and a delivery unit 14 therein. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
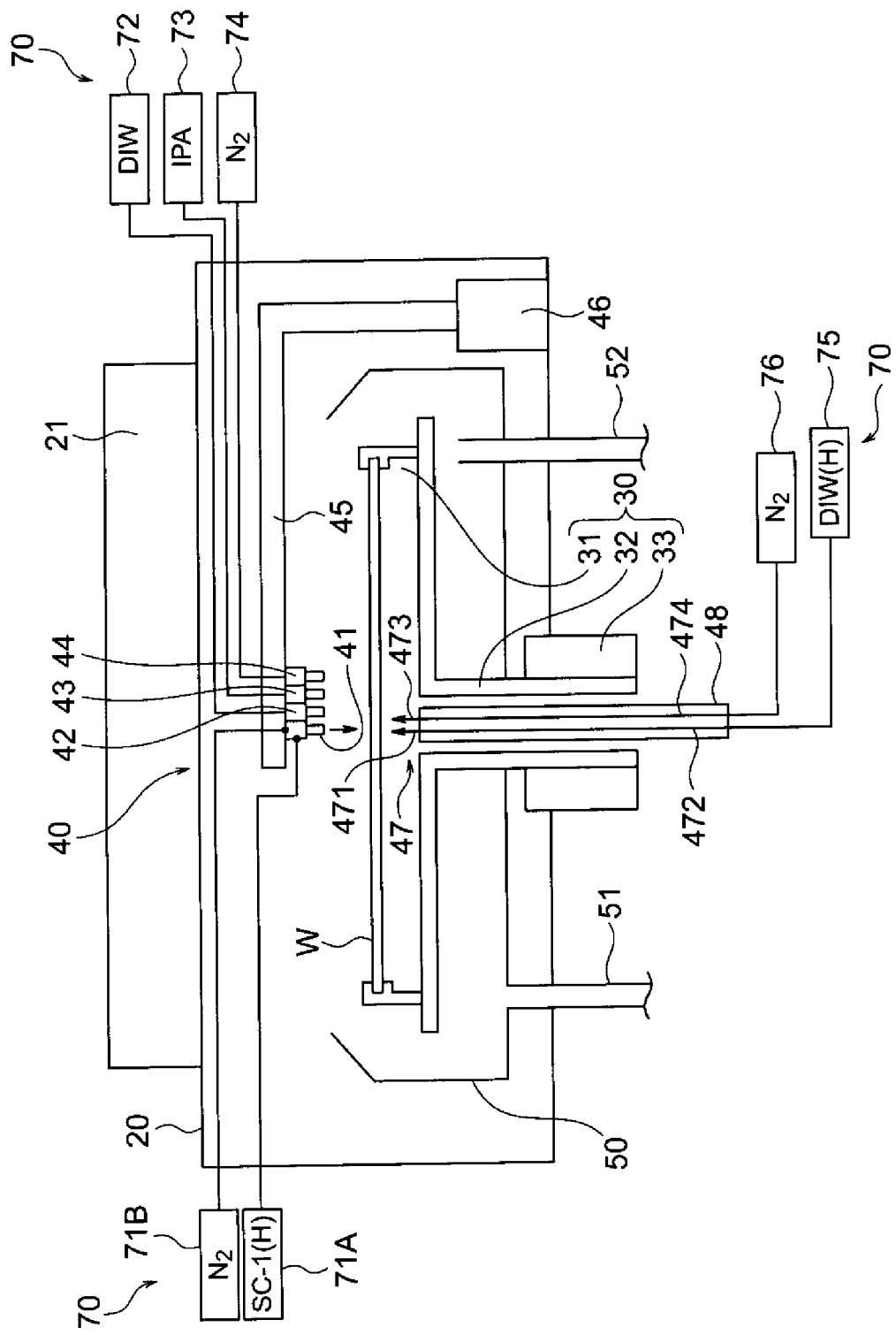
FIG. 2 is a vertical cross-sectional view illustrating a schematic configuration of a processing unit according to a first exemplary embodiment.

Next, a schematic configuration of the processing unit 16 will be described with reference to FIG. 2. FIG. 2 is a view illustrating a schematic configuration of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

The processing fluid supply unit 40 and the processing fluid supply source 70 according to the first exemplary embodiment will be described in more detail. The processing fluid supply unit 40 includes a two-fluid nozzle 41 that ejects droplets (two fluids) formed by mixing a chemical liquid as a processing fluid and a gas with each other to a front surface of a wafer W (a surface of a wafer on which a device is formed), a rinse nozzle 42 that supplies a rinse liquid, for example, deionized water (DIW) to the front surface of the wafer W, a solvent nozzle 43 that supplies a dry auxiliary solvent having a high volatility and a low surface tension, for example, isopropyl alcohol (IPA) to the front surface of the wafer W, and a gas nozzle 44 that supplies a drying gas having a low humidity and a low oxygen concentration such as, for example, $N_2$ gas to the front surface of the wafer W.

The nozzles 41 to 44 are attached to a tip end portion of a nozzle arm 45. The nozzle arm 45 is pivotable around the vertical axis and vertically movable up and down by an arm driving unit 46. Therefore, the nozzles 41 to 44 are movable between a processing position above the wafer W and a retreating position outside the recovery cup 50 in a plan view.

The processing fluid supply unit 40 further includes a lower nozzle 47 that ejects a substrate temperature control liquid as a processing fluid, i.e., heated deionized water (DIW) in this exemplary embodiment, to the rear surface of the wafer W (the rear surface of the wafer on which no device is formed).

The lower nozzle 47 includes a substrate temperature control liquid ejection port 471 from which a substrate temperature control liquid is ejected. The substrate temperature control liquid ejection port 471 is formed by a top end opening of a substrate temperature control liquid passageway 472 that extends vertically within a processing fluid supply column 48. The processing fluid supply column 48 is provided within the support unit 32 (i.e., the rotating shaft) of the hollow of the substrate holding mechanism 30 coaxially with the support unit 32, and supported not to be rotated even when the support unit 32 is rotated.

The lower nozzle 47 is further provided with a gas ejection port 473 that ejects a drying gas with a low humidity and a low oxygen concentration such as, for example, $N_2$ gas. The gas ejection port 473 is formed by a top end opening of a gas passageway 474 that extends in parallel with the substrate temperature control liquid passageway 472 within the processing fluid supply column 48.

The processing fluid supply source 70 includes a heated chemical liquid supply mechanism 71A that supplies heated SC-1 [SC-1 (H)] as a heated chemical liquid to the two-fluid nozzle 41, a gas supply mechanism 71B that supplies a nitrogen gas for making SC-1 into droplets to the two-fluid nozzle 41, a rinse liquid supply mechanism 72 that supplies DIW as a rinse liquid to the rinse nozzle 42, a solvent supply mechanism 73 that supplies IPA to the solvent nozzle 43, a drying gas supply mechanism 74 that supplies a drying nitrogen gas to the gas nozzle 44, a substrate temperature control liquid supply mechanism 75 that supplies heated DIW [DIW (H)] to the substrate temperature control liquid ejection port 471 of the lower nozzle 47, and a drying gas supply mechanism 76 that supplies a drying nitrogen gas to the gas ejection port of the lower nozzle 47.

For the gas supply mechanism 71B, the rinse liquid supply mechanism 72, the solvent supply mechanism 73, the drying gas supply mechanism 74, and the drying gas supply mechanism 76, general mechanisms which are well-known in the field of a semiconductor manufacturing apparatus may be used. That is, these mechanisms may be configured by, for example, pipes connecting processing fluid storage units such as, for example, liquid storage tanks or gas cylinders to their corresponding nozzles, and flow rate control equipment provided in the pipes such as, for example, opening/closing valves and flow rate control valves.

Next, the heated chemical liquid supply mechanism 71A and the substrate temperature control liquid supply mechanism 75 will be described with reference to FIG. 3. The heated chemical liquid supply mechanism 71A and the substrate temperature control liquid supply mechanism 75 have substantially the same configuration, except for forms of nozzles connected thereto. Thus, of the two mechanisms, the heated chemical liquid supply mechanism 71A will be described.

The heated chemical liquid supply mechanism 71A includes a chemical liquid tank 7100 that stores SC-1 (a mixed solution of ammonia water and hydrogen peroxide) (indicated by a double-circle symbol in FIG. 3) therein. Within the chemical liquid tank 7100, ammonia water, hydrogen peroxide, and deionized water (diluent) which are raw materials of SC-1 are mixed with each other at a predetermined mixing ratio so that SC-1 is formulated.

A chemical liquid line 7102 is connected to the chemical liquid tank 7100 and formed by a pipe for feeding SC-1 from the chemical liquid tank 7100. A chemical liquid temperature controller 7104 is interposed in the chemical liquid line 7102. SC-1 supplied to the chemical liquid temperature controller 7104 is heated to a predetermined temperature, for example, 50° C. by a Peltier device as a heat generating element inside the chemical liquid temperature controller 7104, and then, flows out from the chemical liquid temperature controller 7104 to flow into a manifold 7108 in the chemical liquid line 7102.

SC-1 is distributed to a plurality of chemical liquid lines 7110, e.g., four chemical liquid lines 7110 in the present exemplary embodiment, by the manifold 7108. Each chemical liquid line 7110 supplies SC-1 to the two-fluid nozzle 41 of one of the plurality of processing units 16 (see FIG. 1). FIG. 3 represents only one chemical liquid line 7110 in detail.

A large diameter pipe 7114 is provided outside a small diameter pipe 7112 which forms the chemical liquid line 7110, thereby forming a double-pipe structure. A space having an annular cross-section defined between the small diameter pipe 7112 and the large diameter pipe 7114 serves as a water jacket 7116 (a chemical liquid temperature control liquid passageway) that allows a chemical liquid temperature control liquid for controlling a temperature of a chemical liquid (warming a chemical liquid) to flow therethrough.

As the chemical liquid temperature control liquid flowing in the wafer jacket 7116, high purity water such as, for example, DIW may not be used, and plant cooling water (PCW) may be heated and used. PCW is supplied from a PCW supply source 7118 provided in a semiconductor device manufacturing plant to one site of a temperature control liquid circulation system, e.g., the chemical liquid temperature control liquid temperature controller 7120 in the present exemplary embodiment. The PCW is heated by the Peltier device 7106 inside the chemical liquid temperature control liquid temperature controller 7120. When cooling of the chemical liquid temperature control liquid temperature controller 7120 is required, the cooling is performed by using PCW.

A manifold 7124 is connected to the chemical liquid temperature control liquid temperature controller 7120 through a chemical liquid temperature control liquid supply line 7122. A chemical liquid temperature control liquid is distributed to a plurality of chemical liquid temperature control liquid supply lines 7126, e.g., four chemical liquid temperature control liquid supply lines in the present exemplary embodiment, by the manifold 7124. The chemical liquid temperature control liquid distributed to each chemical liquid temperature control liquid supply line 7126 is supplied to the water jacket 7116 of one of the plurality of processing units 16 (see FIG. 1). FIG. 3 represents one chemical liquid temperature control liquid supply line 7126 in detail.

The chemical liquid temperature control liquid supply line 7126 is connected to the wafer jacket 7116 at a position of the downstream side of the chemical liquid line 7110 which is close to the two-fluid nozzle 41. The wafer jacket 7116 is connected to a manifold 7130 at a position of the upstream side of the chemical liquid line 7110. A heat exchange is performed between the chemical liquid temperature control liquid flowing in the water jacket 7116 and SC-1 flowing in the chemical liquid line 7110 through the wall of the pipe 7112 so that SC-1 is warmed, and the temperature thereof may be kept within a desired range. The temperature of the chemical liquid temperature control liquid flowing in the water jacket 7116 is equal to or slightly higher than the temperature of SC-1 flowing in the chemical liquid line 7110.

Water jackets 7116 of the other processing units 16 are also connected to the manifold 7130. The manifold 7130 returns the chemical liquid temperature control liquid to the chemical liquid temperature control liquid temperature controller 7120 through a chemical liquid temperature control liquid return line 7132. The returned chemical liquid temperature control liquid is heated by the chemical liquid temperature control liquid temperature controller 7120 and flows out from the chemical liquid temperature control liquid temperature controller 7120 toward the manifold 7124 again.

In this way, the chemical liquid temperature control liquid is circulated within a circulation route formed by the chemical liquid temperature control liquid temperature controller 7120, the chemical liquid temperature control liquid supply line 7122, the manifold 7130, the chemical liquid temperature control liquid supply line 7126, the water jacket 7116, and the chemical liquid temperature control liquid return line 7132. The chemical liquid temperature control liquid supply line 7122 or the chemical liquid temperature control liquid return line 7132 is provided with a pump (not illustrated) so as to form a circulating flow of the chemical liquid temperature control liquid that passes the circulation route. When a total amount of the chemical liquid temperature control liquid existing within the circulation route is reduced, PCW is replenished into the circulation route (the chemical liquid temperature control liquid temperature controller 7120) from the PCW supply source 7118.

A flow rate control valve 7134 and an opening/closing valve 7136 are interposed in the midway of the chemical liquid line 7110 in order to control the flow of SC-1 supplied to the two-fluid nozzle 41. Hence, the water jacket 7116 is disconnected in the region where the valves 7134 and 7136 are provided. A connecting line 7138 is provided in order to interconnect the ends of the water jacket 7116 which are located at the opposite sides of the disconnected region.

Most parts of the chemical liquid line 7110, the chemical liquid temperature control liquid supply line 7126, and the water jacket 7116 are covered by a heat insulating material 7140 to suppress heat dissipation from the water jacket 7116 to a surrounding environment. By providing the heat insulating material 7140, it becomes easier to keep SC-1 flowing in the chemical liquid line 7110 at a desired temperature.

A temperature sensor 7142 is provided to detect a temperature of a chemical liquid flowing through the downstream side portion of the chemical liquid line 7110 which is close to the two-fluid nozzle 41. The chemical liquid temperature control liquid temperature controller 7120 controls a heat generation amount of the Peltier device 7121 to make a temperature detected by the temperature sensor 7142 reach a predetermined target value (e.g., 50° C.). When the temperature detected by the temperature sensor 7142 is equal to a target value (or falls within a target range), and SC-1 having the target temperature is supplied from the chemical liquid temperature controller 7104 for SC-1, SC-1 having a desired temperature is ejected from the two-fluid nozzle 41.

As described above, the substrate temperature control liquid supply mechanism 75 has substantially the same configuration as that of the heated chemical liquid supply mechanism 71A, except for forms of nozzles connected thereto. Thus, the configuration and the operation of the substrate temperature control liquid supply mechanism 75 that supplies heated DIW as a substrate temperature control liquid for heating a wafer W to the lower nozzle 47 may be understood from the descriptions of the heated chemical liquid supply mechanism 71A in which the term "SC-1 (chemical liquid)" is replaced with "DIW (substrate temperature control liquid)."

Next, descriptions will be made on a series of steps performed in a processing unit 16 of FIG. 2. Here, a processing to remove polymers attached to a surface of a wafer W is performed. In removing polymers attached to a wafer, a temperature range of the SC-1 liquid in which a sufficient removal performance is achieved is narrow, and the temperature of the liquid is required to be managed to become 50° C. on the front surface of the wafer W. In the present exemplary embodiment, in addition to the temperature control at the supplied side of the SC-1 liquid, an appropriate temperature control is performed by a supply of heated DIW to the rear side of the wafer. Each step to be described hereinafter is automatically performed under the control of the control device 4 as described above.

First, an unprocessed wafer W is carried into a processing unit 16 by the arm of the substrate transfer device 17 (see FIG. 1), and this wafer W is held by the substrate holding mechanism 30.

<Chemical Liquid Processing Step>

The wafer W is rotated around the vertical axis by the substrate holding mechanism 30. Heated DIW, i.e., a substrate temperature control liquid is supplied to the lower nozzle 47 from the substrate temperature control liquid supply mechanism 75, and the substrate temperature control liquid is ejected toward the center portion of the rear surface of the wafer W from the temperature control liquid ejection port 471. This substrate temperature control liquid flows and spreads on the rear surface of the wafer W toward the periphery of the wafer W by a centrifugal force so that the rear surface of the wafer W is covered with the substrate temperature control liquid. By the substrate temperature control liquid, the wafer W is heated to a desired temperature, e.g., a temperature substantially equal to that of SC-1 ejected from the two-fluid nozzle 41.

The two-fluid nozzle 41 is positioned just above the center portion of the wafer W. After the wafer W is sufficiently heated by the substrate temperature control liquid ejected from the lower nozzle 47, the two-fluid nozzle 41 is subsequently supplied with an SC-1 liquid from the heated chemical liquid supply mechanism 71A at a controlled temperature and a controlled flow rate and a nitrogen gas from the gas supply mechanism 71B at a controlled flow rate, while the lower nozzle 47 continues to eject the substrate temperature control liquid. The ejection of the substrate temperature control liquid from the lower nozzle 47 is continued by the end of the chemical liquid processing step. That is, the rear surface of the wafer W is covered with the liquid film of the heated DIW which is a substrate temperature control liquid all the time while SC-1 is ejected toward the wafer W from the two-fluid nozzle 41.

As obvious to a person skilled in the art, in the inside of the two-fluid nozzle 41, the SC-1 liquid supplied from the heated chemical liquid supply mechanism 71A joins with the flow of the nitrogen gas supplied at a relatively high flow rate and pressure from the gas supply mechanism 71B so that the SC-1 is formed into droplets. The SC-1 droplets are ejected from the two-fluid nozzle 41 together with the nitrogen gas. The cleaning by SC-1 is facilitated by the physical energy of the droplets.

The nozzle arm 45 pivots so as to move the collision position of the droplets ejected from the two-fluid nozzle 41 on the surface of the wafer W from the center portion of the wafer W to the peripheral portion thereof. The collision position of the droplets may be reciprocally moved between the center portion of the wafer W and the peripheral portion thereof one or more times. Therefore, the surface of the wafer W may be cleaned evenly. SC-1 containing a reaction product and scattered from the front surface of the wafer W by the centrifugal force is received by the recovery cup 50.

<Rinsing Step>

After the end of the chemical liquid processing step, the ejection of the droplets from the two-fluid nozzle 41 and the ejection of the DIW for a temperature control from the lower nozzle 47 are stopped, and a rinsing step for washing the chemical liquid and the reaction product remaining on the surface of the wafer W is performed, while the wafer W is continuously rotated. The rinsing step is performed by supplying DIW as a rinse liquid to the center portion of the wafer W from the rinse nozzle 42 positioned above the center portion of the wafer W.

<Drying Step>

After the end of the rinsing step, the supply of the DIW from the rinse nozzle 42 is stopped, and the front surface of the wafer W is dried by increasing the rotation speed of the wafer W so as to shake off the rinse liquid remaining on the wafer W by the centrifugal force.

Accordingly, the series of liquid processing steps for one wafer W are completed. Thereafter, the wafer W is carried out of the processing unit 16.

According to the above-described exemplary embodiment, when the cleaning of the wafer W is performed by supplying the droplets of SC-1 to the front surface of the wafer together with the nitrogen gas, the heated DIW which is a substrate temperature control liquid is supplied to the rear surface of the wafer W so that a sufficient removal performance may be achieved in removing polymers attached to the wafer W. Further, the in-plane uniformity of the surface temperature of the wafer W which is an object to be processed may be improved. As a result, the in-plane uniformity of the polymer removal may be improved.

In the above-described exemplary embodiment, SC-1 is exemplified as a processing liquid for the droplets ejected from the two-fluid nozzle 41. However, the processing liquid is not limited to SC-1. For example, deionized water may be used as a processing liquid. The cleaning of the wafer W is performed by supplying droplets of high-temperature deionized water to the front (top) surface of the wafer together with the nitrogen gas so that the performance of removing objects such as, for example, particles or polymers is improved compared to the case of using room-temperature deionized water. As in the above-described exemplary embodiment, the heated deionized water which is a substrate temperature control liquid is supplied to the rear (bottom) surface of the wafer W so that the removal performance is further improved. Since the apparatus configuration in the case of using deionized water is implemented by only replacing the above-described configuration of supplying the SC-1 liquid with the configuration of supplying deionized water, descriptions thereof will be omitted.

Next, a second exemplary embodiment will be described with reference to FIG. 4. The second exemplary embodiment relates to a processing liquid supply mechanism which is implemented by combining the substrate temperature control liquid supply mechanism 75 with a part of the heated chemical liquid supply mechanism 71A. In the second exemplary embodiment, members identical to those in the first exemplary embodiment will be denoted by the same reference numerals as used in the first exemplary embodiment, and overlapping descriptions thereof will be omitted.

A substrate temperature control liquid supply mechanism 75' according to the second exemplary embodiment includes a substrate temperature control liquid line 7102 connected to a deionized water supply source 7100 which is a supply source of deionized water (DIW) used as a substrate temperature control liquid. The substrate temperature control liquid line 7102 is provided with an opening/closing valve 7150, a substrate temperature control liquid temperature controller 7104, a pump 7152, a three-way valve 7154, and a manifold 7108 [7108 (DIW)] in this order from the upstream side thereof. The structure of the manifold 7108 and the downstream side thereof is the same as described with reference to FIG. 3. That is, heated DIW as a substrate temperature control liquid is supplied to four lower nozzles 471 through four substrate temperature control liquid lines 7110 [7110 (DIW)]. Each substrate temperature control liquid line 7110 has the double-pipe structure that forms a water jacket as illustrated in FIG. 3, and further, is covered by a heat insulating material as illustrated in FIG. 3. The water jacket formed in the substrate temperature control liquid line 7110 [7110 (DIW)] may be supplied with PCW heated by the temperature control liquid temperature controller 7120 (DIW) illustrated in FIG. 3 (not illustrated in FIG. 4) (to be precise, a temperature controller of a temperature control liquid for controlling a temperature of a substrate temperature control liquid).

A heated chemical liquid supply mechanism 71A' according to the second exemplary embodiment includes two chemical liquid tanks 7160 and 7162 in which SC-1 is stored. These chemical liquid tanks 7160 and 7162 are supplied with ammonia water and hydrogen peroxide which are raw materials of SC-1 from an ammonia water supply source 7164 and a hydrogen peroxide supply source 7166. The composition of SC-1 is also performed within the chemical liquid tanks 7160 and 7162. The chemical liquid tanks 7160 and 7162 are also supplied with DIW as a raw material (diluent) of SC-1. This will be described later.

The chemical lines 7164 and 7166 are connected to the chemical liquid tanks 7160 and 7162, and these chemical lines join with each other to become one chemical liquid line 7168. The chemical liquid line 7168 is connected to a manifold 7108 [7108 (SC-1)]. A pump 7170 is interposed in the chemical liquid line 7168. The pump 7170 is driven by switching opening/closing valves 7165 and 7167 provided in the chemical liquid lines 7164 and 7166 so that SC-1 is sent from one side of the chemical liquid tanks 7160 and 7162 to the manifold 7108 [7108(SC-1)].

Figure 3:
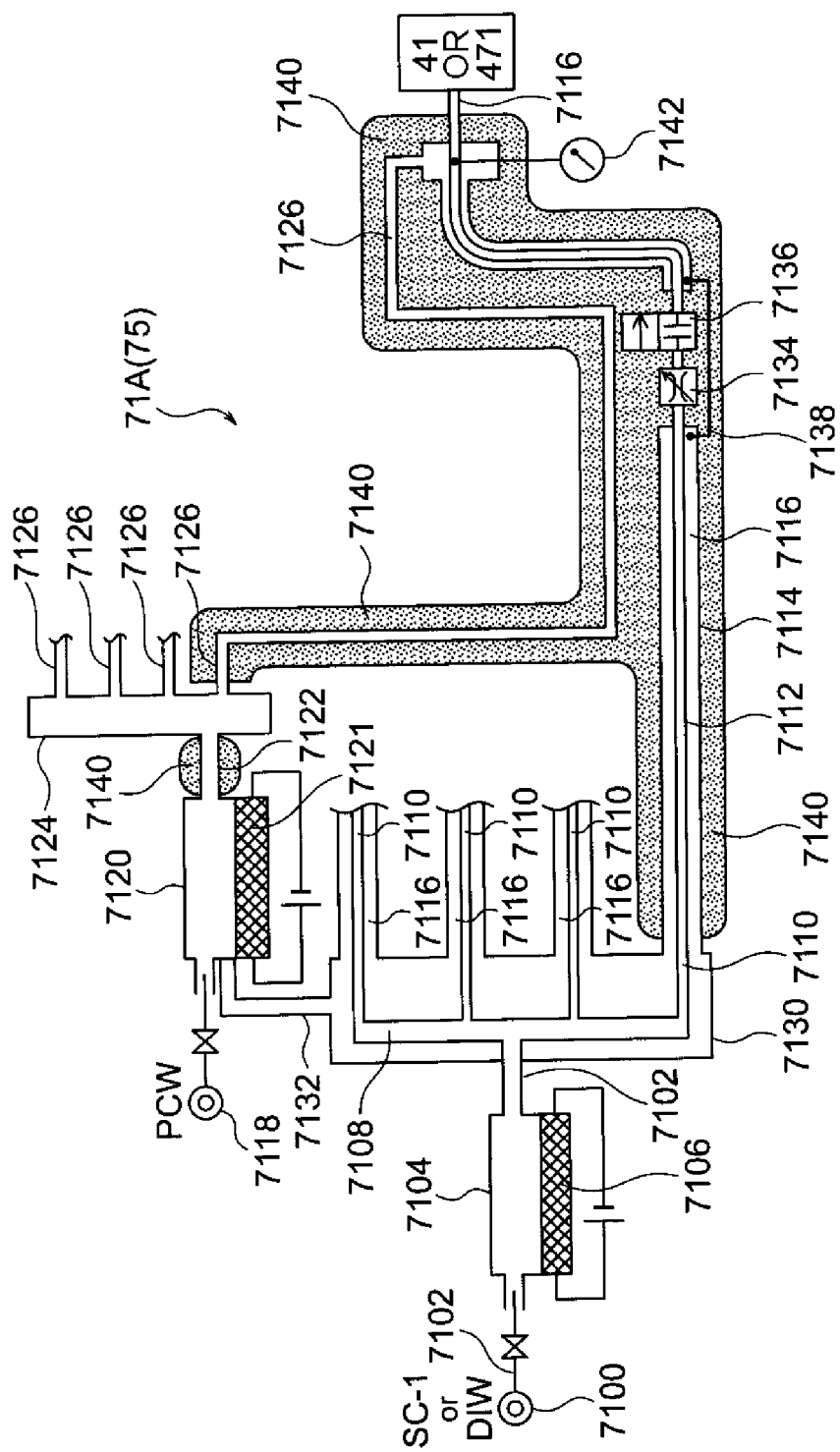
FIG. 3 is a piping system diagram illustrating a configuration of a chemical liquid supply mechanism and a substrate temperature control liquid supply mechanism according to the first exemplary embodiment.

In the heated chemical liquid supply mechanism 71A' according to the second exemplary embodiment, the configuration of the manifold 7108 [7108 (SC-1)] and the downstream side thereof is the same as that of the heated chemical liquid supply mechanism 71A illustrated in FIG. 3. That is, heated SC-1 is supplied to four two-fluid nozzles 41 through four chemical liquid lines 7110 [7110 (SC-1)]. Each chemical liquid line 7110 has the double-pipe structure that forms a water jacket as illustrated in FIG. 3, and is also covered by a heat insulating material as illustrated in FIG. 3. The water jacket formed in the chemical liquid line 7110 [7110 (SC-1)] is supplied with PCW heated by the chemical liquid temperature control liquid temperature controller 7120 illustrated in FIG. 3 (not illustrated in FIG. 4).

A diluent line 7171 is branched from the substrate temperature control liquid line 7102 at the position of the three-way valve 7154 in order to supply DIW (diluent) used for the preparation of SC-1 to the chemical tanks 7160 and 7162. By switching the three-way valve 7154, the DIW flowing in the substrate temperature control liquid line 7102 may be supplied to any one side of the manifold 7108 [7108 (DIW)] and the chemical liquid tanks 7160 and 7162. The diluent line 7171 is branched into diluent lines 7172 and 7174 which are connected to the chemical liquid tanks 7160 and 7162, respectively.

Figure 4:
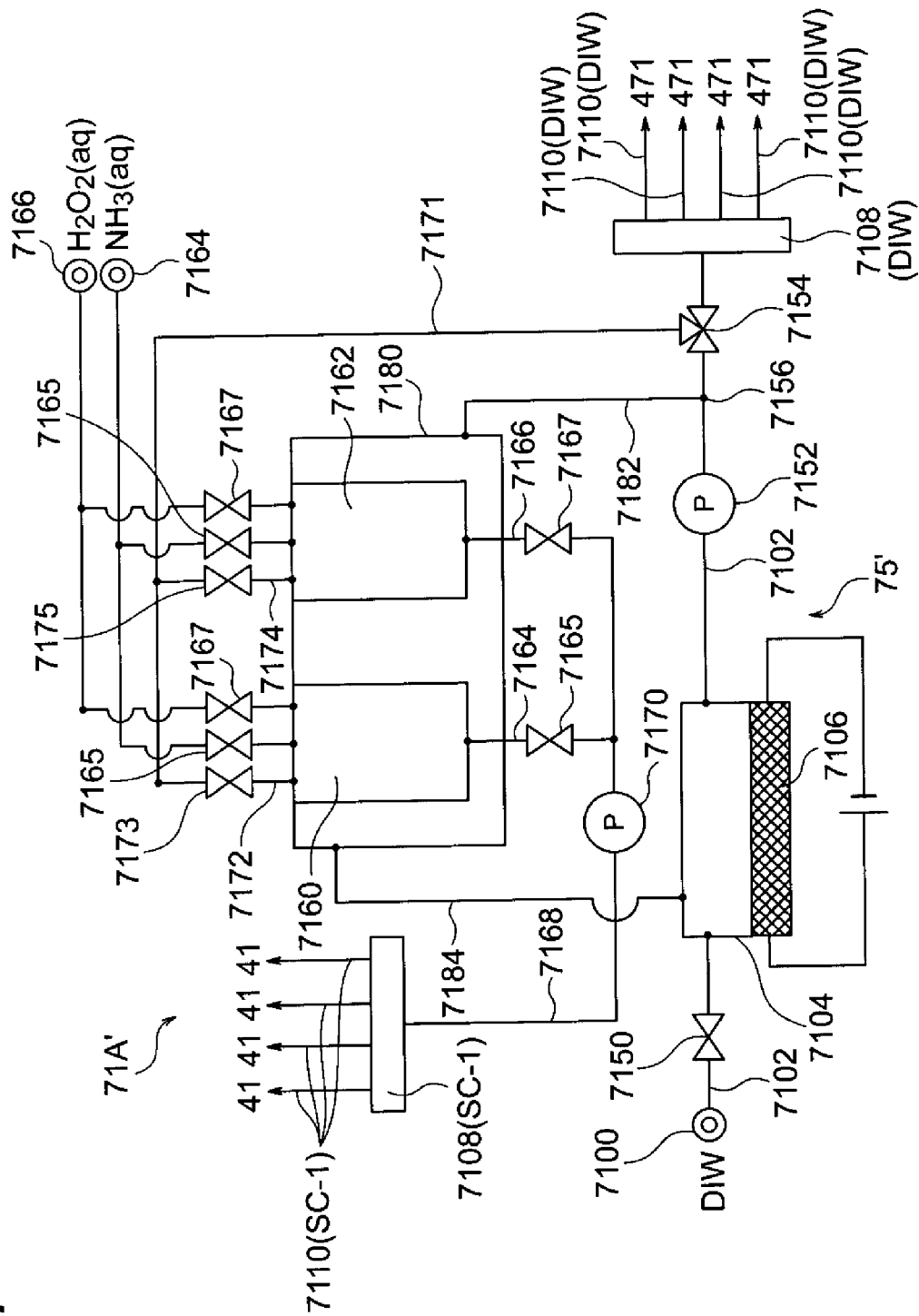
FIG. 4 is a piping system diagram illustrating a configuration of a chemical liquid supply mechanism and a substrate temperature control liquid supply mechanism according to a second exemplary embodiment.

In FIG. 4, the reference numerals 7165, 7167, 7173, and 7175 refer to opening/opening valves. By appropriately switching the opening/closing valves, the raw materials of SC-1 may be supplied to the corresponding chemical liquid tanks 7160 and 7162 thereof.

The chemical liquid tanks 7160 and 7162 are accommodated within a temperature control tank (or a temperature control liquid jacket) 7180. A tank temperature control liquid supply line 7182 is branched from the substrate temperature control liquid line 7102 at a branching point 7156 between the pump 7152 and the three-way valve 7154 to be connected to the temperature control tank 740. A heat exchange occurs between the heated DIW which has been supplied into the temperature control tank 7180 and SC-1 within the chemical liquid tanks 7160 and 7162 through the walls of the chemical liquid tanks 7160 and 7162. As a result, SC-1 within the chemical liquid tanks 7160 and 7162 is kept at a desired temperature. The DIW supplied into the temperature control tank 7180 is returned to the substrate temperature control liquid temperature controller 7104 through a tank temperature control liquid return line 7184.

That is, a circulation route of the DIW for a temperature control is formed by the substrate temperature control liquid temperature controller 7104, a part of the substrate temperature control liquid line 7102, the tank temperature control liquid supply line 7182, the temperature control tank 7180, and the tank temperature control liquid return line 7184. The DIW is always circulated within the circulation route so that the temperature of SC-1 existing within the chemical liquid tanks 7160 and 7162 is kept in a desired temperature range.

Since the branching point 7156 is positioned immediately downstream from the pump 7152, the pressure within the substrate temperature control liquid line 7102 near the branching point 7156 is not largely affected by the switching of the three-way valve 7154 and the status change of the ejection of the DIW from the lower nozzles 471. Therefore, the flow rate of the DIW flowing through the circulation route becomes stable so that the temperature within the chemical liquid tanks 7160 and 7162 may be stably kept in a desired temperature range.

In the second exemplary embodiment as well, the same processings of a wafer W as those in the above-described first exemplary embodiment are performed. The second exemplary embodiment also achieves the same effect as that in the first exemplary embodiment. In addition, the two chemical liquid tanks 7160 and 7162 are alternately used as a supply source of SC-1. Ammonia water, hydrogen peroxide, and DIW are supplied to an unused chemical liquid tank so that SC-1 is formulated.

According to the second exemplary embodiment, a temperature controller dedicated for heating SC-1 is not required. That is, since the high-priced temperature controller is not required, costs for the chemical liquid supply mechanism may be reduced as much.

Next, a third exemplary embodiment will be described. The third exemplary embodiment relates to an improvement of a supply of temperature control DIW to a rear surface of a wafer W and a discharge form thereof.

Figure 5:
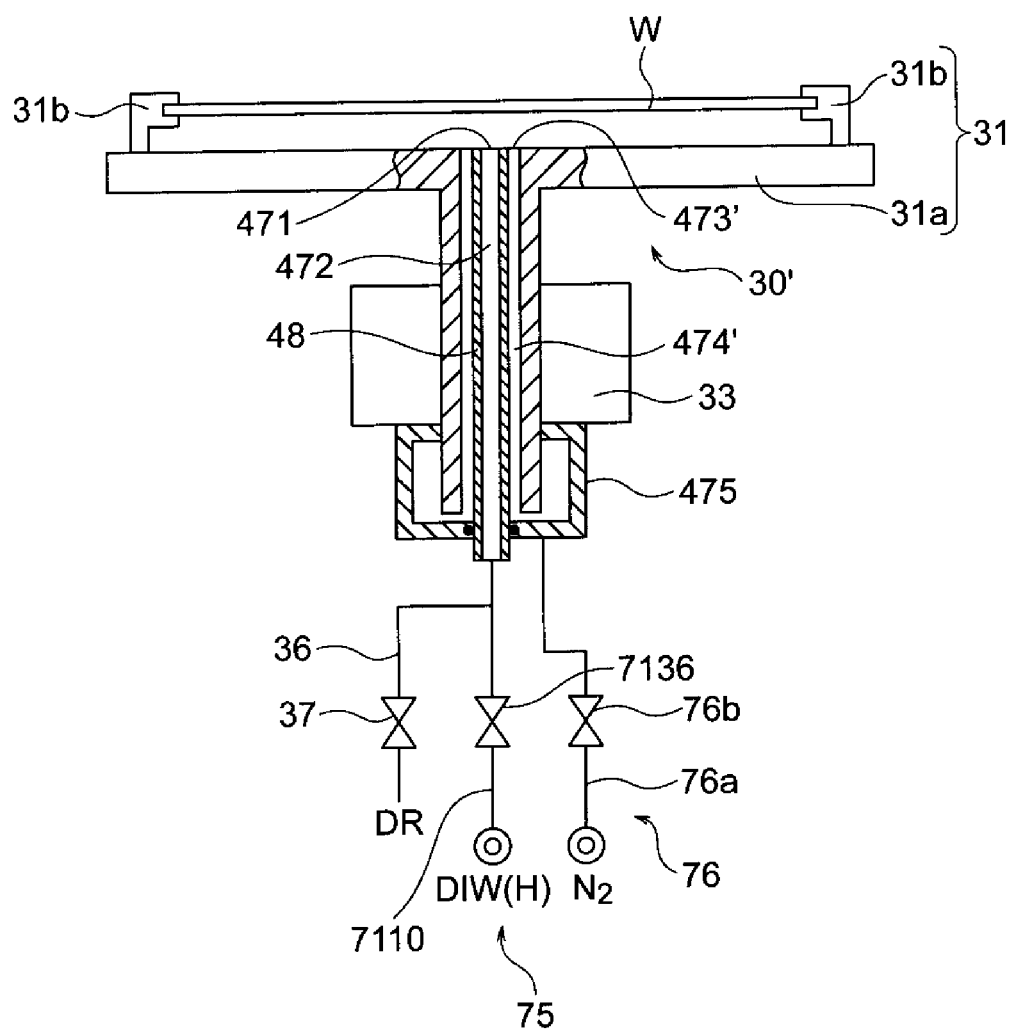
FIG. 5 is a view illustrating a configuration of a substrate holding mechanism and a substrate temperature control liquid supply mechanism according to a third exemplary embodiment.

FIG. 5 illustrates a substrate holding mechanism 30' used in the third exemplary embodiment. A holding portion 31 of the substrate holding mechanism 30' includes a disk-shaped plate portion 31a having a larger diameter than a diameter of a wafer W, and a plurality of holding units 31b provided at the peripheral portion of the plate portion 31a circumferentially at intervals.

In the third exemplary embodiment, a gas passageway 474' is formed between the outer circumferential surface of the processing fluid supply column (processing fluid supply pipe) 48 provided within the support unit 32 and the inner circumferential surface of the support unit 32. The top end opening of the gas passageway 474' is a gas ejection port 473'. The gas passageway 474' may be formed between an inner circumferential surface of a tubular body fitted into the support unit 32 and the outer circumferential surface of the processing fluid supply column 48. The processing fluid supply column 48 is only provided with a substrate temperature control liquid ejection port 471 and a substrate temperature control liquid passageway 472. A gas supply joint 475 is provided in the gas passageway 474' in order to eject a drying gas such as, for example, $N_2$ gas. The gas supply joint 475 is rotated integrally with the support unit 32. A gas line 76a of a drying gas supply mechanism 76 is connected to the gas supply joint 475. By opening an opening/closing valve 76b interposed in the gas line 76a, a drying gas is supplied to the gas supply joint 475 through the gas line 76a. This drying gas flows into the gas passageway 474' from the bottom end opening of the gas passageway 474' to be ejected from the gas ejection port 473'. Although illustration of the detailed structure of the gas supply joint 475 is omitted, the gas supply joint 475 has a function to connect a stopped pipe to a rotating pipe and has a configuration corresponding to a known rotary joint.

The bottom end portion of the processing fluid supply column 48 passes through the gas supply joint 475 and extends downwardly. The substrate temperature control liquid line 7110 [7110 (DIW)] of the substrate temperature control liquid supply mechanism 75, which is identical to that in the first exemplary embodiment, is connected to the substrate temperature control liquid passageway 472. An opening/closing valve 7136 (also see FIG. 3) is interposed in the substrate temperature control liquid line 7110. A drain line 36 in which an opening/closing valve 37 is interposed is connected to the substrate temperature control liquid line 7110. The opening end of the drain line 36 is positioned lower than a height position of a top end opening 35 of a fluid passageway 34 and communicates with an air atmosphere (e.g., an atmosphere within a clean room).

Descriptions will be made on a chemical liquid processing step using the configuration illustrated in FIG. 5 with reference to FIGS. 6A to 6D.

Figure 6A:
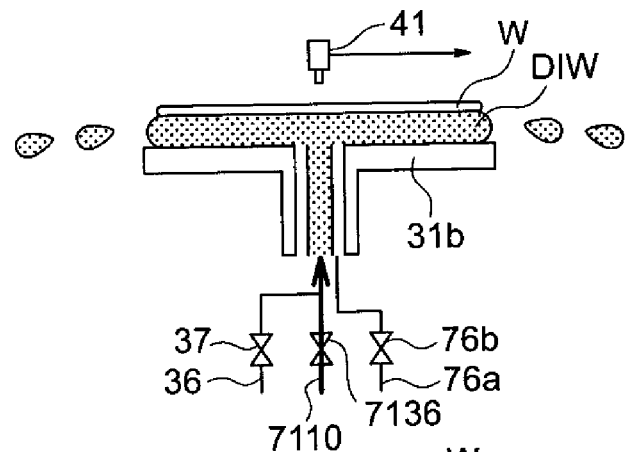
FIGS. 6A to 6D are views illustrating a sequence of supply and discharge of a substrate temperature control liquid according to the third exemplary embodiment.

When the rotation of the wafer W is initiated, and the rotational speed of the wafer W becomes stable, the opening/closing valve 7136 is opened so that heated DIW as a substrate temperature control liquid is ejected from the top end opening of the substrate temperature control liquid passageway 472 (the substrate temperature control liquid ejection port 471), as illustrated in FIG. 6A. In this case, the substrate temperature control liquid is ejected at a sufficiently high flow rate such that the space between the front surface of the plate portion 31a of the holding unit 31 and the rear surface of the wafer W is in a state of being completely filled with the substrate temperature control liquid.

When the temperature of the wafer W increases to a desired temperature by the substrate temperature control liquid that fills the space between the plate portion 31a and the wafer W (or when a predetermined time lapses after the supply of the substrate temperature control liquid), droplets which are formed by mixing SC-1 and a nitrogen gas with each other are supplied to the top (front) surface of the wafer W from the two-fluid nozzle 41 as illustrated in FIG. 6A. By moving the collision position of the droplets ejected from the two-fluid nozzle 41 on the front surface of the wafer W up to the center portion of the wafer W and causing the droplets to collide with the entire front surface of the wafer W, the entire front surface of the wafer W is processed with the droplets.

After the above-described operation is performed for a predetermined period of time, the ejection of the droplets from the two-fluid nozzle 41 is stopped, and a rinsing step and a drying step are performed on the front surface of the wafer W as in the first exemplary embodiment. Hereinafter, detailed descriptions of the processings performed on the front surface of the wafer W will be omitted, and descriptions will be made on the processing performed on the rear surface of the wafer W.

Figure 6B:
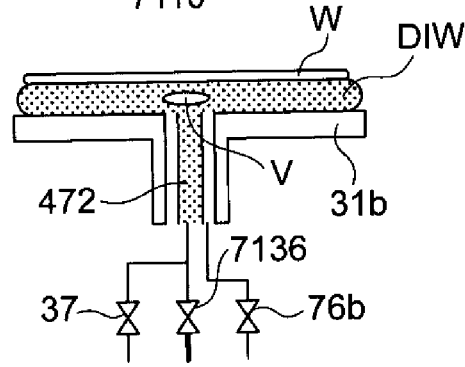

The ejection of the substrate temperature control liquid (DIW) from the substrate temperature control liquid ejection port 471 is stopped at an appropriate time after the end of the chemical liquid processing step on the front surface of the wafer, e.g., at the time of the end of the rinsing step. In this case, all the opening/closing valve 7136 of the substrate temperature control liquid line 7110, the opening/closing valve 76b of the gas line 76a, and the opening/closing valve 37 of the drain line 36 are closed. In this state, the rotational speed of the wafer W is increased. Since all the opening/closing valves 7136, 76b, and 37 are closed, the substrate temperature control liquid existing within the fluid passageway 34 is difficult to move. Meanwhile, the substrate temperature control liquid tends to move radially outwardly by the centrifugal force acting on the substrate temperature control liquid that fills the space between the rear surface of the wafer W and the front surface of the plate portion 31a. Hence, as illustrated in FIG. 6B, a vacuum region V is formed below the center portion of the rear surface of the wafer W.

Figure 6C:
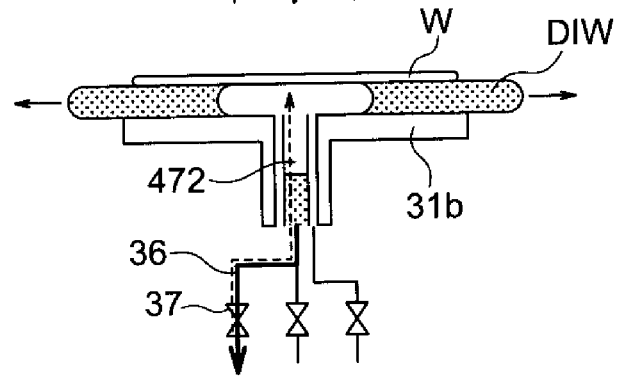

In this state, when the opening/closing valve 37 of the drain line 36 is opened, the substrate temperature control liquid existing within the substrate temperature control liquid passageway 472 is discharged as indicated by the solid line arrow in FIG. 6C so that outside air is introduced as generally indicated by the dashed line arrow in FIG. 6C. In such a case, a space to which an atmospheric pressure is applied is formed below the center portion of the wafer W. Thus, the substrate temperature control liquid that has been subject to the centrifugal force is moved outwardly at once and evenly discharged from the space between the rear surface of the wafer W and the front surface of the plate portion 31a in the circumferential direction.

Subsequently, the opening/closing valve 37 of the drain line 36 is closed, and the opening/closing valve 76b of the gas line 76a is opened so as to supply pressurized nitrogen gas to the space between the rear surface of the wafer W and the front surface of the plate portion 31a and purge the space with the nitrogen gas. Therefore, the rear surface of the wafer W may be effectively dried.

Figure 6D:
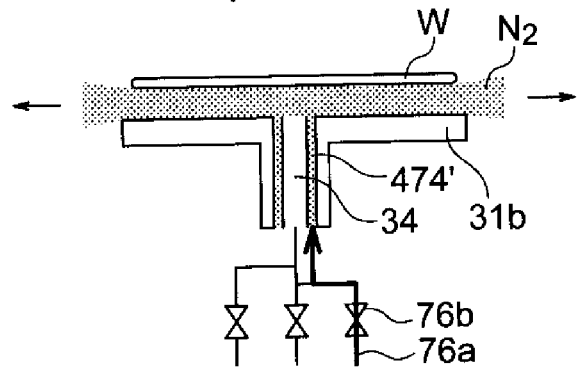

According to the third exemplary embodiment, the entire space between the rear surface of the wafer W and the front surface of the plate portion 31a is filled with the substrate temperature control liquid so that the entire wafer W is heated quickly and uniformly. Therefore, the temperature distribution of the wafer W, and furthermore, the in-plane uniformity of the processing result may be further improved. Further, after the entire space between the wafer W and the plate portion 31a is filled with the substrate temperature control liquid, the purging sequence that is represented in FIGS. 6B to 6D is performed so that the substrate temperature control liquid existing at the rear surface side of the wafer W is purged evenly and effectively in the circumferential direction. Thus, the wafer W may be dried in a short time period.

Figure 7:
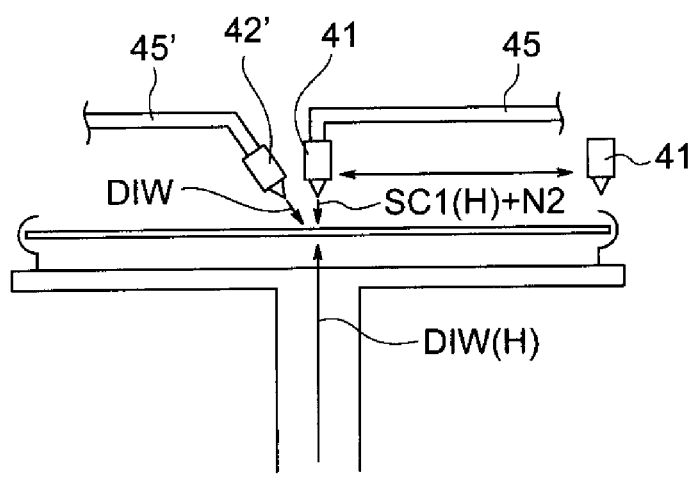
FIG. 7 is a view for describing a modification of a chemical liquid processing step of the first exemplary embodiment.

Next, two modifications of the chemical liquid processing step of the first exemplary embodiment will be described with reference to FIG. 7. Here, a case will be taken into account in which a liquid landing position of the droplets of SC-1 included in the two fluids ejected from the two-fluid nozzle 41 on the front surface of the wafer W is changed by reciprocally moving the two-fluid nozzle 41 between the position just above the center portion of the wafer W and the position just above the peripheral portion of the wafer W.

In this case, since the wafer W is being rotated, SC-1 landing on the front surface of the wafer W flows toward the peripheral of the wafer W by the centrifugal force. Further, since heated DIW (substrate temperature control liquid) is being supplied to the center portion of the rear surface of the wafer W from the lower nozzle 47, the temperature of the center portion of the wafer W is slightly higher than that of the peripheral portion thereof. Hence, the liquid film of SC-1 is difficult to be maintained at the center portion of the front surface of the wafer W (i.e., the center portion of the front surface of the wafer W is easy dried). Especially, since particles are easily generated when the front surface of the wafer W is dry during the chemical liquid processing, it is required to suppress the drying.

Descriptions will be made on a first method for suppressing the drying (i.e., a first modification of the chemical liquid processing step of the first exemplary embodiment). As schematically illustrated in FIG. 7, a processing unit 16 is provided with a nozzle 42' held by a nozzle arm 45' which is separate from the nozzle arm 45 holding the two-fluid nozzle 41. While two fluids (SC-1 and nitrogen gas) are supplied to the wafer W from the two-fluid nozzle 41 by reciprocally moving the two-fluid nozzle 41 between the position above the center portion of the wafer W and the position above the peripheral portion of the wafer W, the nozzle 42' continuously supplies DIW to the center portion of the front surface of the wafer W. Therefore, it is possible to suppress a liquid film from being lost at the center portion of the front surface of the wafer W when the two-fluid nozzle 41 is positioned beyond the center portion of the wafer W (especially immediately before the two-fluid nozzle 41 is returned to the center portion of the wafer). The flow rate of the ejection of the DIW from the nozzle 42' may be a minimum flow rate enough to maintain the liquid film. In addition, the DIW ejected from the nozzle 42' may have a room temperature or a high temperature to suppress the decrease of the temperature of the wafer W. In addition, since the liquid supplied from the nozzle 42' is required to at least act as a drying suppressing liquid which is capable of suppressing drying of the center portion of the front surface of the wafer W, liquids other than the above-described DIW, for example, SC-1 (preferably, a non-two-fluid liquid) may be supplied as the drying suppressing liquid to the center portion of the front surface of the wafer W. In this case, SC-1 supplied to the wafer W from the two-fluid nozzle 41 is diluted with the DIW supplied from the nozzle 42' thereby suppressing the occurrence of the concentration decrease.

Descriptions will be made on a second method for suppressing the drying (a second modification of the chemical liquid processing step of the first exemplary embodiment). Without supplying the drying suppressing liquid by a separate nozzle, the loss of the liquid film on the wafer W may also be suppressed by reciprocally moving the two-fluid nozzle 41 between the center portion of the wafer W and the peripheral portion thereof. That is, when reciprocally operating the two-fluid nozzle 41 between the center portion of the wafer W and the peripheral portion thereof, the moving speed of the two-fluid nozzle 41 is set at the peripheral side of the wafer W and the center side of the wafer W rather than the supply position of the droplets on the wafer W so as to suppress the droplets from being lost at a portion of the wafer W. Here, the drying may be suppressed as the two-fluid nozzle 41 is reciprocally moved at a high speed, but there may be an undesired effect that causes the droplets to be easily scattered to the outside of the cup.

The inventors of the present disclosure measured a time lapse (drying time) from a time point that the two-fluid nozzle 41 starts from the position just above the center portion of the wafer W to a time point that a liquid film is lost in at least a portion of the center portion of the wafer W. Then, the inventors discovered that the drying time is shortened with increase of the temperature of the DIW supplied as a substrate temperature control liquid to the center portion of the rear surface of the wafer W from the lower nozzle 4.

From this result, it may be understood that it is beneficial to set the moving speed of the two-fluid nozzle 41 to be relatively low when the temperature of the substrate temperature control liquid supplied from the lower nozzle 47 is relatively low. Meanwhile, it may be understood that it is beneficial to increase the moving speed of the two-fluid nozzle 41 when the temperature of the substrate temperature control liquid supplied from the lower nozzle 47 is relatively high. That is, a value for one side of the temperature of the substrate temperature control liquid and the moving speed of the two-fluid nozzle 41 may be determined depending on a value for the other side.

Next, a fourth exemplary embodiment will be described with reference to FIGS. 8 to 10. The fourth exemplary embodiment relates to a disposal of mists of a chemical liquid which are scattered around the wafer W after being ejected from the two-fluid nozzle 41 and colliding with the rotating wafer W. In the fourth exemplary embodiment, the substrate holding mechanism 30, the lower nozzle 47, and the processing fluid supply source 70 associated with the lower nozzle 47 may be identically configured to those of the first exemplary embodiment.

A cup (cup assembly) 150 is provided around the substrate holding mechanism 30 and has a different configuration from that of the recovery cup 50 of the first exemplary embodiment. The cup 150 includes a lower cup body 151 surrounding the periphery of the wafer W held by the substrate holding mechanism 30, an upper cup body 152 provided above the lower cup body 151, an external cup body 153 configured to hold the lower cup body 151 and the upper cup body 152, and a bottom cup body 154 provided below the cup bodies 151, 152, and 153.

A discharge line 170 is connected to the bottom portion of the bottom cup body 154. A gas-liquid separation device 171 is interposed in the discharge line 170. An exhaust line 172 and a drain line 173 are connected to the gas-liquid separation device 171. The internal space of the cup 150 is sucked through the exhaust line 172 and the discharge line 170. The exhaust line 172 is connected to a plant exhaust system in a decompressed atmosphere. An ejector or an exhaust pump may be interposed in the exhaust line 172.

The lower cup body 151 includes a substantially cylindrical lower portion 151a and a substantially truncated cone-shaped upper portion 151b that extends radially inwardly and obliquely upwardly from the top end of the lower portion 151a. Likewise, the upper cup body 152 also includes a substantially cylindrical lower portion 152a and a substantially truncated cone-shaped upper portion 152b that extends radially inwardly and obliquely upwardly from the top end of the lower portion 152a.

The external cup body 153 includes a support surface 153a configured to support the lower cup body 151 and a support surface 153b configured to support the upper cup body 152, in the inner circumference thereof. In FIG. 8, a gap (which is not seen in FIG. 8) is provided between the mutually facing surfaces of the lower cup body 151 and the external cup body 153 which seem to be in contact with each other. A liquid attached to the outside relative to the top end of the upper portion 15b of the lower cup body 151 (including a liquid attached to a front surface of a partition plate 161 to be described later) may flow down between the lower cup body 151 and the external cup body 153 through the gap provided outside the lower portion 151a. Likewise, a gap (which is not seen in FIG. 8) is provided between the mutually facing surfaces of the upper cup body 152 and the external cup body 153 which seem to be in contact with each other. A liquid attached to the outside relative to the top end of the upper portion 152b of the upper cup body 152 may flow down between the upper cup body 152 and the external cup body 153 through the gap provided outside the lower portion 152a.

Figure 9:
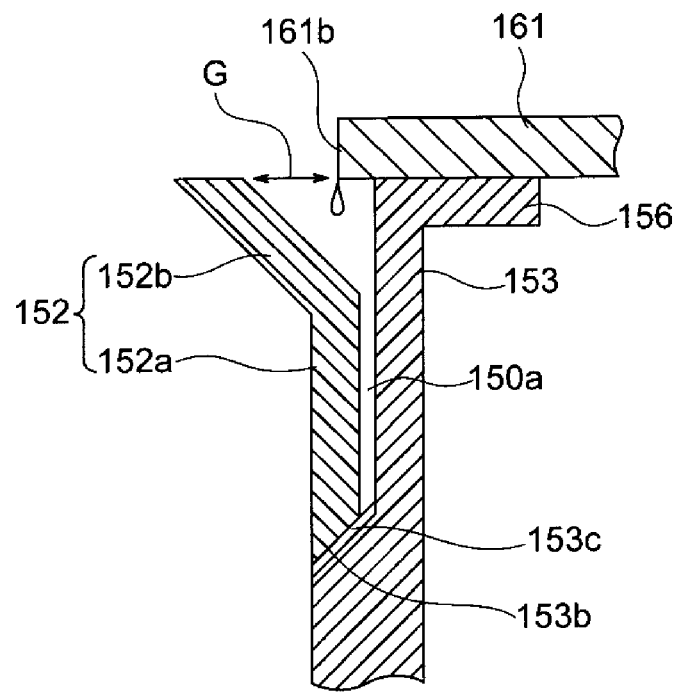
FIG. 9 is an enlarged cross-sectional view of region IX of FIG. 8.

The form of the gap is arbitrary, and an exemplary form is illustrated in FIG. 9. That is, a sufficiently large gap 150a exists between the outer circumferential surface of the cylindrical lower portion 152a of the upper cup body 152 and the inner circumferential surface of the external cup body 153 to extend vertically so as to enable a liquid to pass therethrough. A plurality of grooves 153c is provided on the support surface 153b circumferentially at intervals. Through the grooves 153c, a liquid may pass from the outside of the lower portion 152a to the lower side of the lower portion 152a which is the inner side of the lower portion 152a. The gap between the lower cup body 151 and the external cup body 153 may also be in the same form.

Figure 8:
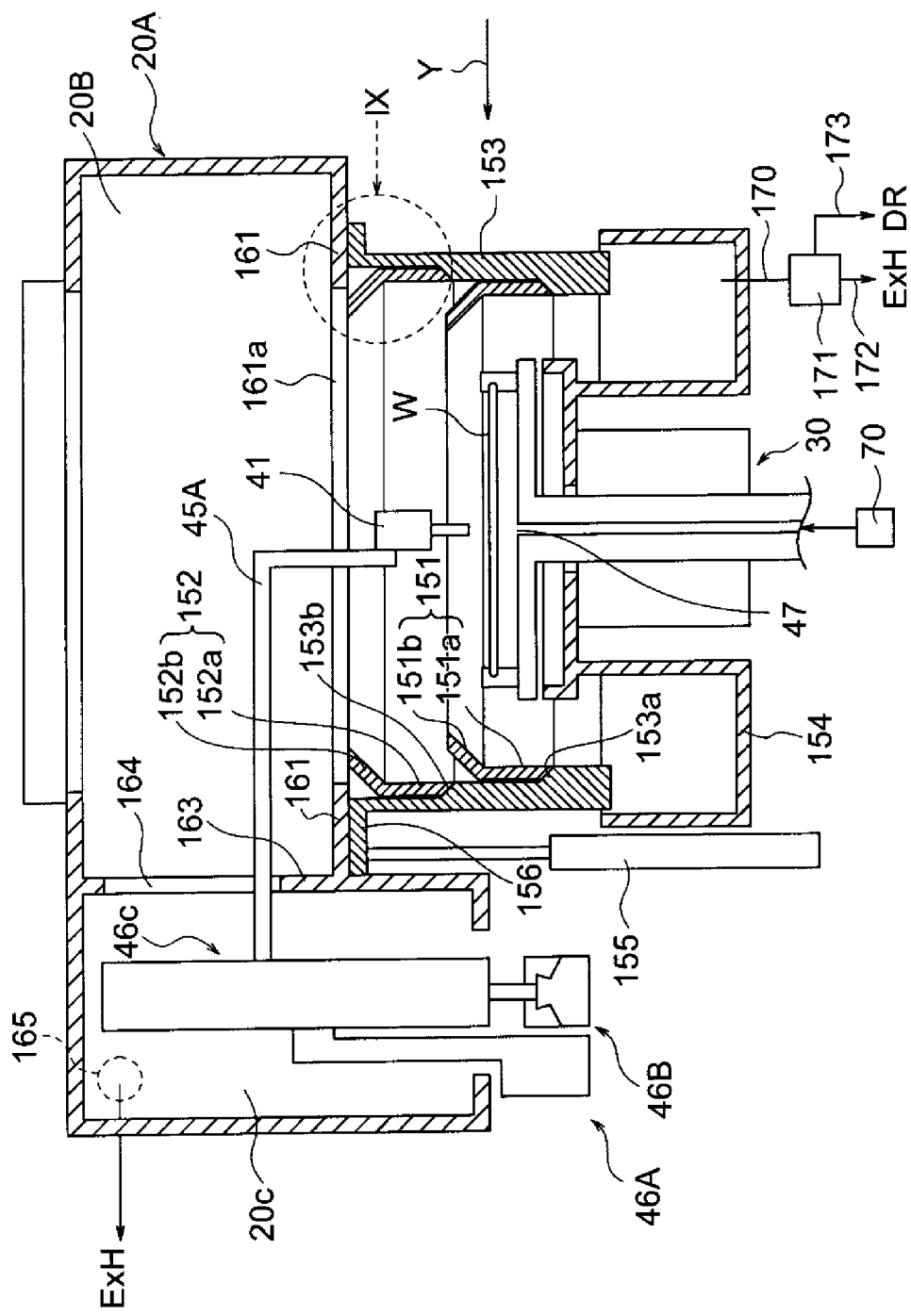
FIG. 8 is a schematic vertical cross-sectional view of a processing unit according to a fourth exemplary embodiment.

As illustrated in FIG. 8, a flange 156 is provided at the top end portion of the external cup body 153 to extend radially outwardly. A linear actuator 155 which is configured by, for example, a ball screw or an air cylinder is attached to the flange 156. The external cup body 153 may be moved up and down by operating the linear actuator 155. With the up-and-down movement of the external cup body 153, the lower cup body 151 and the upper cup body 152 which are supported by the external cup body 153 are also moved up and down.

When performing a processing on a wafer W, the external cup body 153 is moved up to the upper limit position indicated in FIG. 8. In this case, the lower cup body 151 receives droplets (mists) of SC-1 scattered to the outside of the wafer W after being supplied to the rotating wafer W from the two-fluid nozzle 41, and drops the droplets into the bottom cup body 154. The upper cup body 152 receives droplets of SC-1 scattered radially outwardly and upwardly beyond the lower cup body 151. SC-1 received by the upper cup body 152 passes between the lower cup body 151 and the external cup body 153 to be dropped into the bottom cup body 154.

The partition plate 161 is provided above the external cup body 153 to serve as the bottom wall of the chamber 20A. A hole 161a is formed in the partition plate 161 concentrically with the cup 150. When the external cup body 153 is located at the upper limit position, the flange 156 of the external cup body 153 comes in contact with the rear surface of the partition plate 161. In this case, a gap G (see FIG. 9) exists between the top end of the upper portion 152b of the upper cup body 152 and an edge 161b of the hole of the partition plate 161. That is, when droplets LD of SC-1 dropped on the partition plate 161 after being ejected from the two-fluid nozzle 41 and bounced on the surface of the wafer W are dropped downwardly from the edge 161b of the hole 161a of the partition plate 161, the droplets are not dropped into the upper cup body 152. That is, the droplets flow down along the outer circumferential surface of the upper portion 152b of the upper cup body 152, and further, flow down along the inner circumferential surface of the external cup body 153. Finally, the droplets are dropped into the bottom cup 154 to be discharged to the discharge line 170 from the bottom cup 154. Therefore, it is unlikely that droplets first dropped on the partition plate 161 to be contaminated are dropped on the wafer W thereby contaminating the wafer W. In the present exemplary embodiment, the partition plate 161 has surfaces horizontal to the X and Y axis directions, but the shape thereof is not limited as long as the partition plate defines a portion of the processing chamber 20A and partitions the inside space and the outside space of the processing chamber 20A by coming in contact with the top end of the external cup body 153 when the external cup body 153 is moved up. Accordingly, the partition plate 161 may be a surface inclined downwardly toward the direction of the center portion of the wafer W or a curved surface.

In addition, by moving down the external cup body 153 to a lower limit position (not illustrated), the top ends of the external cup body 153 and the upper cup body 152 may be positioned below the holding unit 31 of the substrate holding mechanism 30 and the wafer W held by the holding unit 31. Therefore, when carrying in/out a wafer W with respect to a processing unit 16, the transfer of the wafer W may be performed between the arm (see FIG. 1) of the substrate transfer device 17, which moves horizontally (see the arrow Y of FIG. 8) and enters into the processing unit 16, and the holding unit 31.

The inside space of the chamber 20A of the processing unit 16 is partitioned into two sections by a partition plate 163. A first section 20B is a space positioned above the wafer W, and a second section 20C is a space positioned next to the first section 20B and accommodates the driving mechanism 46A of the nozzle arm 45A therein. The partition plate 163 is provided in order to suppress the driving mechanism 46A from being contaminated by droplets of SC-1 scattered from the front surface of the wafer W after being ejected from the two-fluid nozzle 41.

As schematically illustrated in FIG. 8, the driving mechanism 46A of the present exemplary embodiment includes a horizontal driving portion 46B and an up-and-down movement driving portion 46C. The horizontal driving portion 46B drives the nozzle arm 45A so as to translationally move the two-fluid nozzle 41 held by the nozzle arm 45A between the position just above the center portion of the wafer W and the position just above the standby position (the groove position). The up-and-down movement driving portion 46C drives the nozzle arm 45A so as to cause the two-fluid nozzle 41 to move vertically.

A slit 164 is formed in the partition plate 163 in order to allow a required movement of the nozzle arm 45A. The shape of the slit 164 is appropriately determined depending on the movement pattern of the nozzle arm 45A. The opening area of the slit 164 is set to be as small as possible in order not to damage the mist blocking function of the partition plate 163.

Figure 10:
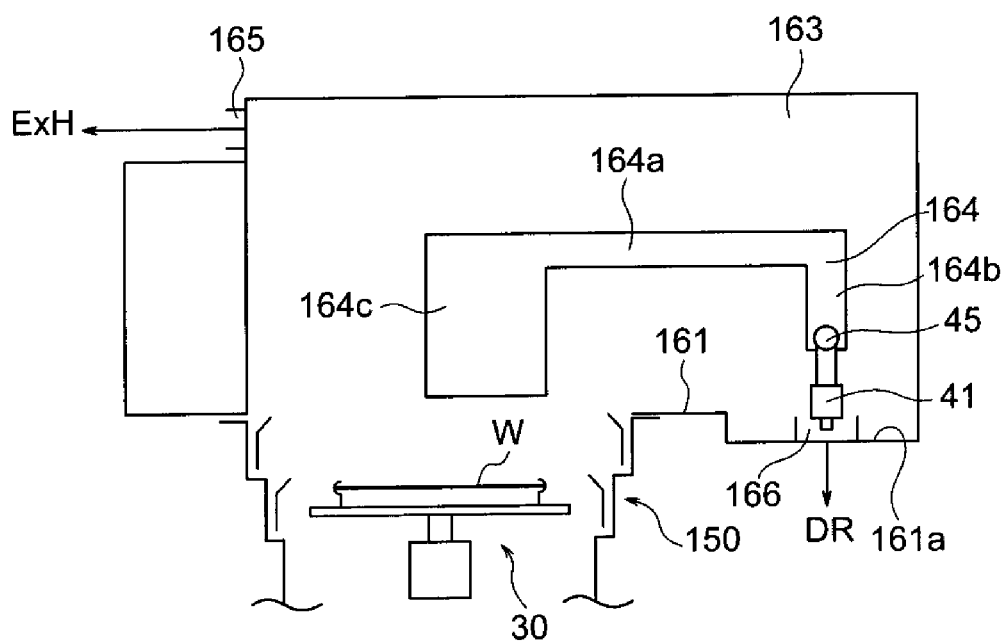
FIG. 10 is a schematic cross-sectional view of the processing unit according to the fourth exemplary embodiment when viewed from another side thereof.

In the present exemplary embodiment, as illustrated in FIG. 10, the slit 164 includes a horizontal portion 164a and two vertical portions 164b and 164c that extend downwardly from the opposite ends of the horizontal portion. By this shape, the two-fluid nozzle 41 held by the nozzle arm 45A may move between the standby position and the processing position (the position above the wafer) without colliding with surrounding components such as, for example, the cup 150. Further, the two-fluid nozzle 41 may be located at any position between the position just above the center portion of the wafer W and the position just above the peripheral portion of the wafer in a state of being close to the front surface of the wafer W.

In order to remove mists, which enter into the second section 2C from the first section 20B through the slit 164, from the second section 20C, an exhaust port 165 is provided in the wall of the chamber 20A that defines the space 20C. The atmosphere within the space 20C is sucked by an exhaust mechanism (not illustrated) connected to the exhaust port 165 such as, for example, an exhaust pump or an ejector. In addition, the exhaust port 165 may be provided in an upper portion of the space 20C so that the mists may be discharged quickly from the space 20C before the mists settle down.

A portion 161a of the partition plate 161 which is positioned below the two-fluid nozzle 41 and the nozzle arm 45A is positioned lower than the portion of the partition plate 161 near the cup 151. A liquid receiver 166 is provided in the portion 161a of the partition plate 161 to receive a liquid ejected as a dummy dispense from the two-fluid nozzle 41 or dropped from the two-fluid nozzle 41. The liquid received by the liquid receiver 166 is discharged through a drain line connected to the liquid receiver 166.

In the fourth exemplary embodiment, configurations and operations of portions of the processing unit 16 which are not described above may be the same as those in the first exemplary embodiment. For example, the nozzles 42, 43, and 44 of the first exemplary embodiment may be provided in the nozzle arm 45A of the fourth exemplary embodiment such that the series of processings may be performed on one wafer W in the same sequence as that in the first exemplary embodiment. Further, the liquid receiver that receives a liquid ejected or dropped from the nozzles 42, 43, and 44 may be provided in the portion 161a of the partition plate 161.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing apparatus comprising:
a substrate holder configured to hold a substrate;
a chemical liquid supply including a chemical liquid heater and configured to heat a chemical liquid and supply the heated chemical liquid through a manifold to a chemical liquid pipe;
a temperature control liquid supply including a temperature control liquid heater and configured to control a temperature of a temperature control liquid and circulate the temperature control liquid through a water jacket surrounding a substantial portion of the chemical liquid pipe, such that the heated chemical liquid flowing through the substantial portion of the chemical liquid pipe is maintained at a predetermined temperature by the temperature control liquid;
a gas supply configured to supply a gas;
a deionized water supply configured to heat deionized water and supply heated deionized water through a deionized water line;
a first nozzle configured to eject droplets of the heated chemical liquid toward a front surface of the substrate, the droplets being formed by mixing the gas supplied by the gas supply and the heated chemical liquid supplied by the chemical liquid supply with each other;
a second nozzle configured to eject the heated deionized water supplied by the deionized water supply toward a rear surface of the substrate; and
a controller configured to control an overall operation of the substrate processing apparatus,
wherein the controller is configured to control the first nozzle and the second nozzle such that the first nozzle supplies the droplets of the heated chemical liquid to the front surface of the substrate while the second nozzle supplies the heated deionized water to the rear surface of the substrate in order to heat the substrate by the heated deionized water, and
the temperature control liquid forming a closed-loop such that the temperature control liquid circulates from the temperature control liquid supply, through the water jacket, and returns to the temperature control liquid supply, the water jacket surrounding the chemical liquid pipe along only a returning portion of the closed-loop formed by the temperature control liquid,
wherein the chemical liquid pipe includes a valve positioned downstream from the manifold and the water jacket being disconnected in a region of the valve, the water jacket forming disconnected ends on either side of the valve along the chemical liquid pipe.

2. The substrate processing apparatus of claim 1, further comprising a secondary temperature control liquid supply including a secondary temperature control liquid heater and configured to control a temperature of a secondary temperature control liquid and circulate the secondary temperature control liquid through a secondary water jacket configured to surround a substantial portion of the deionized water line, such that the heated deionized water flowing through the substantial portion of the deionized water line is maintained at a predetermined temperature by the secondary temperature control liquid,
the secondary temperature control liquid forming a closed-loop such that the secondary temperature control liquid circulates from the secondary temperature control liquid supply, through the secondary water jacket, and returns to the secondary temperature control liquid supply.

3. The substrate processing apparatus of claim 2, wherein the predetermined temperature of the heated deionized water maintained by the secondary temperature control liquid supply and supplied to the substrate, and the predetermined temperature of the heated chemical liquid maintained by the temperature control liquid supply and supplied to the substrate, are equal.

4. The substrate processing apparatus of claim 1, wherein the chemical liquid supply includes a chemical liquid tank configured to store the chemical liquid,
the deionized water supply includes a deionized water temperature controller configured to heat the deionized water to be supplied to the second nozzle, and
a deionized water jacket is provided to surround a periphery of the chemical liquid tank, the deionized water heated by the deionized water temperature controller is supplied to the heated deionized water jacket so as to warm or heat the chemical liquid stored within the chemical liquid tank, and the deionized water discharged from the heated deionized water jacket is returned to the deionized water temperature controller.

5. The substrate processing apparatus of claim 4, wherein the chemical liquid is obtained by diluting a chemical liquid component with deionized water,
the deionized water supply further includes a first branched line that is branched from the deionized water line to supply the heated deionized water flowing in the deionized water line as a diluent for formulating the chemical liquid to the chemical liquid tank, and a second branched line that is branched from the deionized water line to supply the heated deionized water flowing in the deionized water line to the heated deionized water jacket, and a position where the second branched line is branched from the deionized water line is placed upstream of a position where the first branched line is branched from the deionized water line.

6. The substrate processing apparatus of claim 1, wherein the substrate holder includes a plate portion that is disposed below the substrate to face the substrate, and a holder that is provided at a peripheral portion of the plate portion to hold the peripheral portion of the substrate, and
the controller is configured to control the first nozzle and the second nozzle such that the first nozzle supplies the droplets to the front surface of the substrate in a state where the space between the substrate and the plate portion is filled with the heated deionized water ejected from the second nozzle.

7. The substrate processing apparatus of claim 1 further comprising:
a rotation driver configured to rotate the substrate holder, and
a recovery cup that surrounds a periphery of the substrate holder and receives and recovers the chemical liquid scattered from the substrate held by the substrate holder to be rotated,
wherein the recovery cup includes:
an upper cup body that includes an upper portion inclined radially inwardly toward a top end thereof and a cylindrical lower portion; and
a groove that is adhered to the outside relative to the top end of the upper portion of the upper cup body so as to enable a liquid passing downwardly outside the lower portion of the upper cup body to flow downwardly inwardly relative to the lower portion.

8. The substrate processing apparatus of claim 7, wherein the recovery cup further includes a cylindrical external cup body that supports the upper cup body therein and is relatively movable up and down with respect to the substrate holder, and
a gap is formed between the external cup body and the lower portion of the upper cup body so as to enable a liquid to pass between the external cup body and the lower portion of the upper cup body.

9. The substrate processing apparatus of claim 8 further comprising:
a partition plate that defines a portion of a processing chamber to contact a top end of the external cup body when the external cup body is moved up,
wherein a liquid attached to the partition plate passes through the gap between the external cup body and the lower portion of the upper cup body.

10. The substrate processing apparatus of claim 1, further comprising:
a partition plate that defines a bottom surface of a processing chamber,
a rotation driver that rotates the substrate holder,
a recovery cup that surrounds the periphery of the substrate holder and receives and recovers the chemical liquid scattered from the substrate held by the substrate holder to be rotated,
a nozzle arm configured to hold the first nozzle, and
an arm driver configured to cause the nozzle arm to move,
wherein a height of the partition plate in a region where the nozzle arm stands by is lower than a height of the partition plate in a region around the recovery cup.

11. The substrate processing apparatus of claim 1 further comprising:
a nozzle arm that holds the first nozzle,
an arm driver that causes the nozzle arm to move, and
a partition plate that partitions the processing chamber into a first section positioned above the substrate holder and a second section positioned at a lateral side of the first section to accommodate the arm driver,
wherein a slit is formed in the partition plate to allow the movement of the nozzle arm.

12. The substrate processing apparatus of claim 11, wherein an exhaust port is provided in an upper portion of the second section to suck the atmosphere of the second section.

13. The substrate processing apparatus of claim 1, wherein the chemical liquid heater is a Peltier device.

14. The substrate processing apparatus of claim 13, further comprising:
a temperature sensor provided at a downstream side of the chemical liquid pipe which is closed to the first nozzle and configured to detect the temperature of the heated chemical liquid flowing through the downstream side of the chemical liquid pipe,
wherein the temperature controller is configured to control a heat generation amount of the Peltier device such that the temperature of the heated chemical liquid detected by the temperature sensor reaches a predetermined target value.

15. The substrate processing apparatus of claim 1, wherein temperature of the temperature control liquid flowing in the water jacket is equal to or higher than that of the heated chemical liquid flowing in the chemical liquid pipe.

16. The substrate processing apparatus of claim 1, wherein the chemical liquid pipe and the water jacket are covered by a heat insulating material.

17. The substrate processing apparatus of claim 1, further comprising:
a drying gas supply configured to supply a drying gas; and
a gas ejection port configured to eject the drying gas supplied by the drying gas supply toward the rear surface of the substrate.

18. The substrate processing apparatus of claim 1, further comprising a connecting line interconnecting the disconnected ends of the water jacket, the connecting line being separate from the chemical liquid pipe.

19. The substrate processing apparatus of claim 1, wherein the water jacket surrounds both the manifold and the substantial portion of the chemical liquid pipe.

20. A substrate liquid processing method of a substrate processing apparatus comprising:
- holding a substrate via a substrate holder;
- heating a chemical liquid from a chemical liquid supply with a chemical liquid heater and supplying a heated chemical liquid through a manifold to a chemical liquid pipe;
- controlling a temperature of a temperature control liquid from a temperature control liquid supply with a temperature control liquid heater;
- circulating the temperature control liquid through a water jacket surrounding a substantial portion of the chemical liquid pipe such that the heated chemical liquid flowing through the substantial portion of the chemical liquid pipe is maintained at a predetermined temperature by the temperature control liquid;
- ejecting droplets of the chemical liquid toward a front surface of the substrate via a first nozzle, the droplets being formed by mixing a gas supplied by a gas supply and the heated chemical liquid with each other; and
- ejecting heated deionized water supplied by a deionized water supply toward a rear surface of the substrate via a second nozzle, and
- wherein the temperature control liquid forms a closed-loop through the water jacket, and the water jacket surrounds the chemical liquid pipe along only a returning portion of the closed-loop formed by the temperature control liquid, and
- wherein the chemical liquid pipe includes a valve positioned downstream from the manifold and the water jacket being disconnected in a region of the valve, the water jacket forming disconnected ends on either side of the valve along the chemical liquid pipe.

21. The substrate liquid processing method of claim 20, wherein the substrate holder includes a plate portion that is disposed below the substrate to face the substrate, and a holder that is provided at a peripheral portion of the plate portion to hold the peripheral portion of the substrate,
the space between the substrate and the plate portion is filled with the heated deionized water by the ejecting of the heated deionized water toward the rear surface of the substrate from the second nozzle, and in this state, the ejecting of the droplets from the first nozzle is performed.

22. The substrate liquid processing method of claim 20, wherein the ejecting of the droplets from the first nozzle is performed by moving a liquid landing point of the droplets on the front surface of the substrate between a center portion of the substrate and a peripheral portion thereof while rotating the substrate, and
the substrate liquid processing method further includes ejecting a drying suppressing liquid toward the center portion of the front surface of the substrate during the ejecting of the droplets.

23. The substrate liquid processing method of claim 20, wherein the ejecting of the droplets from the first nozzle is performed by moving a liquid landing point of the droplets on the front surface of the substrate between the center portion of the substrate and the peripheral portion thereof while rotating the substrate, and
a moving speed of the liquid landing point of the droplets is determined depending on the temperature of the heated deionized water to be ejected from the second nozzle.

24. The substrate liquid processing method of claim 20, wherein the heated deionized water is ejected toward the rear surface of the substrate from the second nozzle after the initiation of the ejecting of the droplets from the first nozzle toward the front surface of the substrate.

25. The substrate liquid processing method of claim 13, wherein the ejecting of the droplets from the first nozzle is performed by moving a liquid landing point of the droplets on the front surface of the substrate between the center portion of the substrate and the peripheral portion thereof while rotating the substrate, and
a moving speed of the liquid landing point of the droplets is set to a speed at which a liquid film of the chemical liquid on the front surface of the substrate is not lost.

26. The substrate liquid processing method of claim 20, wherein the heated deionized water is ejected toward the rear surface of the substrate from the second nozzle after the initiation of the ejecting of the droplets from the first nozzle toward the front surface of the substrate, the ejecting of the droplets from the first nozzle is performed by moving a liquid landing point of the droplets on the front surface of the substrate between the center portion of the substrate and the peripheral portion thereof while rotating the substrate, and
a moving speed of the liquid landing point of the droplets is set to a speed at which a liquid film of the chemical liquid on the front surface of the substrate is not lost.

* * * * *